United States Patent
Iwasaki et al.

(10) Patent No.: US 6,984,586 B2
(45) Date of Patent: Jan. 10, 2006

(54) METHOD OF THINNING SEMICONDUCTOR WAFER CAPABLE OF PREVENTING ITS FRONT FROM BEING CONTAMINATED AND BACK GRINDING DEVICE FOR SEMICONDUCTOR WAFERS

(75) Inventors: Noriki Iwasaki, Nara (JP); Satoru Fukunaga, Osaka (JP); Tadayuki Into, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 238 days.

(21) Appl. No.: 10/318,017

(22) Filed: Dec. 13, 2002

(65) Prior Publication Data

US 2003/0082915 A1 May 1, 2003

Related U.S. Application Data

(62) Division of application No. 09/866,704, filed on May 30, 2001, now Pat. No. 6,520,844.

(30) Foreign Application Priority Data

Aug. 4, 2000 (JP) .............................. 2000-236894

(51) Int. Cl.
*H01L 21/302* (2006.01)
*H01L 21/461* (2006.01)

(52) U.S. Cl. ....................... 438/690; 438/691; 438/692

(58) Field of Classification Search ........ 438/460–464, 438/689–693
See application file for complete search history.

(56) References Cited

U.S. PATENT DOCUMENTS

| 5,122,481 A | * | 6/1992 | Nishiguchi ................... 438/510 |
| 5,827,779 A | * | 10/1998 | Masumura et al. .......... 438/691 |
| 5,942,445 A | * | 8/1999 | Kato et al. ................... 438/691 |
| 5,964,646 A | * | 10/1999 | Kassir et al. ................. 451/41 |
| 6,030,275 A | * | 2/2000 | Lofaro ........................... 451/5 |
| 6,153,536 A | * | 11/2000 | Brouillette et al. .......... 438/758 |
| 6,193,586 B1 | * | 2/2001 | Park et al. ..................... 451/41 |
| 6,342,434 B1 | * | 1/2002 | Miyamoto et al. ........... 438/464 |
| 6,406,357 B1 | * | 6/2002 | Kazui et al. ................... 451/41 |
| 2002/0004305 A1 | * | 1/2002 | Vasal et al. .................. 438/690 |
| 2002/0016135 A1 | * | 2/2002 | Iwasaki et al. ............... 451/41 |
| 2002/0034860 A1 | | 3/2002 | Miyamoto et al. |
| 2002/0048907 A1 | | 4/2002 | Miyamoto et al. |

FOREIGN PATENT DOCUMENTS

| JP | 6-310480 | | 11/1994 |
| JP | 11-145089 | * | 5/1999 |
| JP | 2000-353682 | * | 12/2000 |
| JP | 2001-148412 A | | 5/2001 |
| KR | 1999-0071818 A | | 9/1999 |

* cited by examiner

Primary Examiner—Duy-Vu N. Deo
(74) Attorney, Agent, or Firm—Nixon & Vanderhye P.C.

(57) ABSTRACT

In a method of thinning a semiconductor wafer, a protection tape smaller in size than the semiconductor wafer is applied to a front of the semiconductor wafer, and a back of the semiconductor wafer is etched. In the etching process, a chemical liquid falls down from the semiconductor wafer without being accumulated on the protection tape because the protection tape is smaller in size than the semiconductor wafer.

5 Claims, 6 Drawing Sheets

Fig.6B PRIOR ART $W \leqq L$

METHOD OF THINNING SEMICONDUCTOR WAFER CAPABLE OF PREVENTING ITS FRONT FROM BEING CONTAMINATED AND BACK GRINDING DEVICE FOR SEMICONDUCTOR WAFERS

This application is a division of application Ser. No. 09/866,704, filed May 30, 2001, now U.S. Pat. No. 6,520,844.

BACKGROUND OF THE INVENTION

The present invention relates to a method of thinning semiconductor wafers by applying a protection tape to the front of a semiconductor wafer and conducting grinding/etching of the back thereof. The present invention also relates to a back grinding device for grinding the back of a semiconductor wafer with a protection tape attached to the front thereof.

In recent years, thinner semiconductor packages have been in demand. To realize the thinner semiconductor packages, a step of thinning wafers is introduced after completion of a wafer process in a semiconductor assembling operation. In this step, generally, a protection tape is attached to the front of a wafer, and then the back thereof is abraded by grinding.

Further, for the purpose of further thinning the wafers and increasing transverse strength of semiconductor chips by removing a wafer damage layer generated in a grinding process, the back of ground wafers is more and more often subjected to wet etching (hereinafter just referred to as etching).

Generally, when a protection tape is attached to the front of the wafer to grind the back thereof, the size of the protection tape is set to be equal to or larger than the size of the wafer. This is because in the grinding process, by thus setting the size of the protection tape which is disposed between a wafer and a grinding table, the protection tape is allowed to be uniformly present between the wafer and the grinding table. As a result, vibration of the wafer is suppressed and the stable grinding of the back is realized.

In a generally adopted method of attaching the protection tape to the front of the wafer, which is disclosed in Japanese Patent Laid-Open Publication No. HEI 6-310480, a long tape is applied to the front of a wafer, and then the tape is cut along the peripheral edge of the wafer. Another method in practical use is a method of attaching a sheet which has preparatorily been cut to be round to the front of a wafer.

Figure 5A:
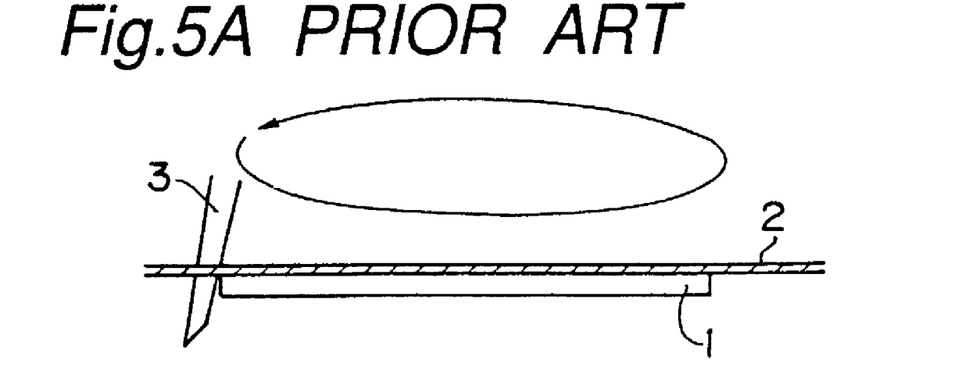
FIGS. 5A, 5B and 5C schematically show the conventional method for grinding and etching the back of a wafer.
Figure 5B:
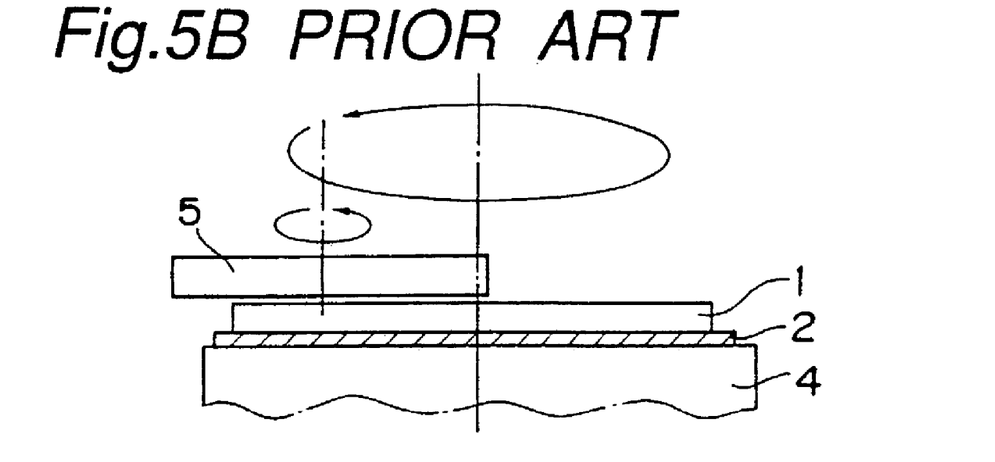
Figure 5C:
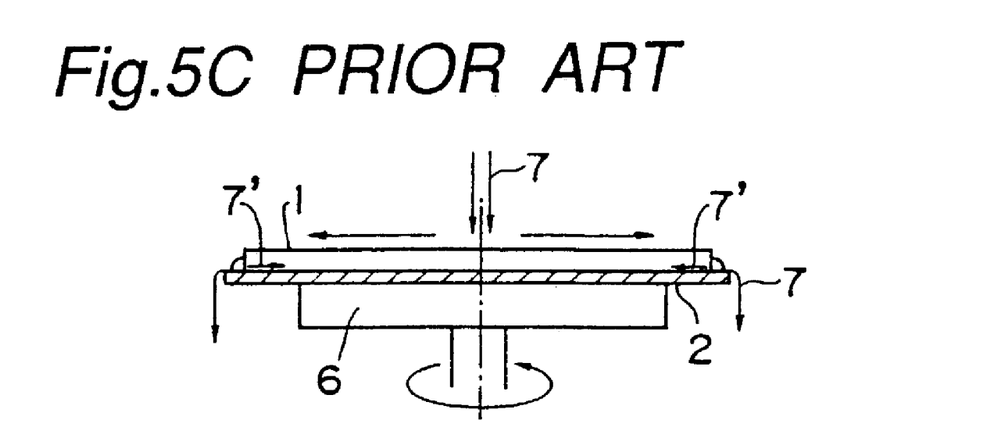

FIGS. 5A–5C are schematic explanatory views showing a method of thinning a wafer in which the front of the wafer is first ground and then etched.

In this thinning method, as shown in FIG. 5A, a protection tape 2 is first applied to the front of a wafer 1, and then a portion of the protection tape 2 protruded from the wafer 1 is cut away along the peripheral edge of the wafer with a cutter 3. Next, as shown in FIG. 5B, the wafer 1 is fixed to a vacuum chuck table 4 for the grinding via the protection tape 2. Then, the vacuum table 4 is rotated, and the back of the wafer 1 is brought into contact with a rotating grinding wheel 5 to conduct grinding. After that, as shown in FIG. 5C, the ground wafer 1 is fixed to a vacuum chuck table 6 for the etching via the protection tape 2. The vacuum chuck table 6 is then rotated, and chemical liquid 7 is applied to the rotating wafer 1 from an upper position to conduct etching of the back of the wafer 1.

Figure 6A:
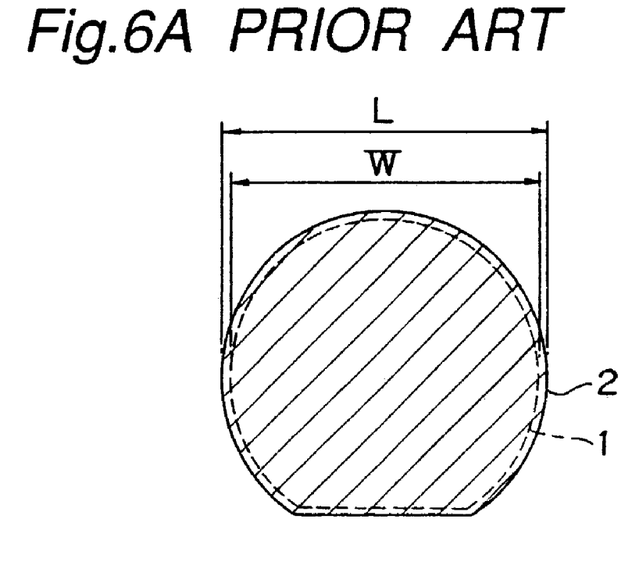
FIGS. 6A and 6B show a relationship between the diameter of a wafer and the diameter of a protection tape used in the method shown in FIGS. 5A–5C.
Figure 6B:
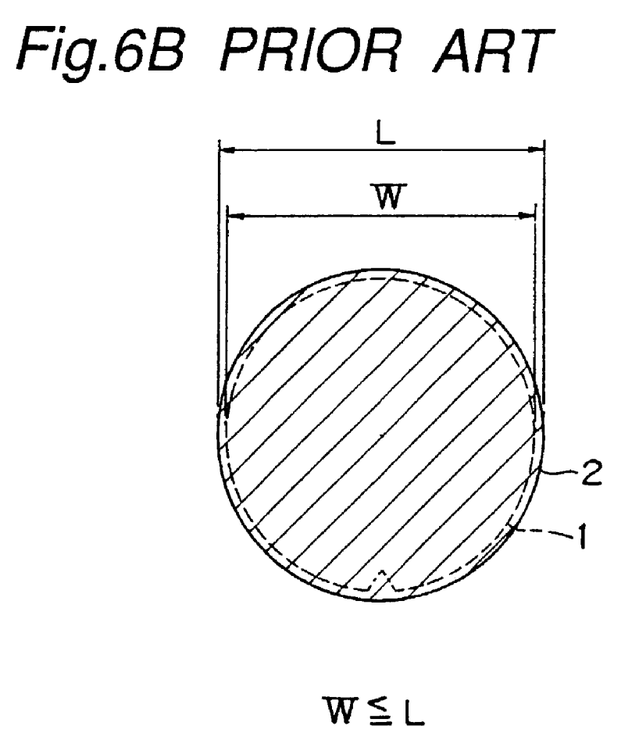

However, the conventional thinning method in which the back of wafers are ground and then etched has the following problems. First, in the case where the diameter W of the wafer 1 is smaller than the diameter L of the protection tape 2, as shown in FIGS. 6A and 6B, the chemical liquid 7 tends to be accumulated on the protection tape 2 in an area around the periphery of the wafer 1 during the etching process. Consequently, part 7' of the accumulated chemical liquid 7 infiltrates toward the front side of the wafer 1, and thereby contaminates the front of the wafer.

On the other hand, in the case where the diameter W of the wafer 1 is equal to the diameter L of the protection tape 2, the peripheral edge of the wafer 1 is etched by chemical liquid 7, which gradually decreases the diameter W of the wafer 1. As a result, the diameter L of the protection tape 2 becomes larger than the diameter W, which generates the same effect as stated above, resulting in contamination of the front of the wafer 1. Therefore, in the case of W≦L, deterioration of quality and reliability of devices is inevitable.

SUMMARY OF THE INVENTION

Accordingly, it is an object of the present invention to provide a method of thinning a semiconductor wafer which can eliminate contamination of the front of the wafer to thereby provide good quality and reliability of semiconductor devices. It is also an object of the present invention to provide a back grinding device for grinding the back of a semiconductor wafer with a protection tape attached to the front thereof to implement the method of thinning the semiconductor wafers.

In order to accomplish the above object, the present invention provides a method of thinning a semiconductor wafer, comprising:

applying a protection tape to a front of the semiconductor wafer, and etching a back of the semiconductor wafer to thereby thin the semiconductor wafer, wherein the protection tape is smaller in size than the semiconductor wafer.

According to the above constitution, when a semiconductor wafer is fixed to a vacuum chuck stage via a protection tape and the back of the semiconductor wafer is etched, chemical liquid applied to the wafer falls down without remaining on the protection tape in the peripheral portion of the semiconductor wafer. This prevents the chemical liquid from infiltrating into a front surface of the semiconductor wafer and causing contamination of the surface.

In one embodiment, the method further comprises, between applying a protection tape to a front of the semiconductor wafer and etching a back of the semiconductor wafer, grinding the back of the semiconductor wafer.

In one embodiment, a diameter W of the semiconductor wafer and a diameter L of the protection tape have the following relationship:

$$L = W - a \ (0 \text{ mm} < a \leq 3 \text{ mm}).$$

According to the above constitution, in the process of grinding the back, a stable grinding operation is performed without vibration generated by a grinding force of a grinding wheel which in turn would cause breakage of the periphery of the semiconductor wafer In addition, in the process of etching the back, the diameter of the protection tape disposed between the semiconductor wafer and the vacuum chuck stage will not become larger than the diameter of the semiconductor wafer, which ensures a stable etching.

Further, in one embodiment, the semiconductor wafer has a chamfered portion along an edge thereof, and no peripheral portion of the protection tape overlaps the chamfered portion of the edge of the semiconductor wafer.

According to the above constitution, because the peripheral portion of the protection tape attached to the semiconductor wafer does not overlap the chamfered portion of the wafer edge, the attached protection tape is not detached at its edge from the wafer.

The present invention also provides a back grinding device for semiconductor wafers for grinding a back of a semiconductor wafer with a protection tape attached to a front thereof, the protection tape being smaller in size than the semiconductor wafer, comprising:

a first vacuum chuck stage for vacuum-fixing a first area of the front of the semiconductor wafer thereto via the protection tape, the first area being an area in which the protection tape being attached to the front of the semiconductor wafer, and a second vacuum chuck stage for vacuum-fixing a second area of the front of the semiconductor wafer thereto, the second area being a peripheral area of the front of the semiconductor wafer in which no protection tape is attached thereto.

With the above constitution, the first area attached with the protection tape is the front vacuum-fixed to the first vacuum chuck stage. Further, the second area attached with no protection tape is vacuum-fixed to the second vacuum chuck stage. Thus, the entire front of the semiconductor wafer is vacuum fixed. Consequently, vibration will hardly be generated when the peripheral portion of the back of the semiconductor wafer is ground, and therefore a stable grinding operation for the back of the semiconductor wafer is achieved without necessity of increasing particle size of the grinding wheel or decreasing the back grinding seed.

In one embodiment, the back grinding device further comprises:

a distance detector for detecting a distance between the second area of the semiconductor wafer and a surface of the first vacuum chuck stage to which surface the semiconductor wafer is fixed; and a second vacuum chuck stage displacement means for raising the second vacuum chuck stage by a distance obtained from a detection result by the distance detector to bring the second vacuum chuck stage into contact with the second area of the semiconductor wafer and, upon completion of grinding the back of the wafer, lowering the second vacuum chuck stage to a level equal to the first vacuum chuck stage.

With the above constitution, when the second area of the semiconductor wafer is vacuum-fixed to the second vacuum chuck stage, the distance detector detects a distance between the surface of the first vacuum chuck stage to which the semiconductor wafer is fixed and the second area of the semiconductor wafer. Then, the second vacuum chuck stage displacement means raises the second vacuum chuck stage by a distance obtained on the basis of a detection result of the distance detector until the second vacuum chuck stage is brought into contact with the second area of the semiconductor wafer. Consequently, even if the thickness of the protection tape varies, the second area of the semiconductor wafer is not dragged nor thrust by the second vacuum chuck stage and thus, the semiconductor wafer is vacuum-fixed in a stable condition without bending.

Further, upon completion of grinding of the back of the wafer, the second vacuum chuck stage displacement means lowers the second vacuum chuck stage to a level equal to the first vacuum chuck stage. This enables simultaneous cleaning of the upper surfaces of the first vacuum chuck stage 23 and the second vacuum chuck stage 24, thereby facilitating removal of grinding dust and the like generated in the back grinding process.

Further, in one embodiment, the first vacuum chuck stage has a diameter slightly larger than or equal to a diameter of the protect tape.

According to the above constitution, when the second vacuum chuck stage is raised to be brought into contact with the second area of the semiconductor wafer, the second vacuum chuck stage is allowed to be raised quickly and smoothly to the contact position without touching the protection tape. In addition, the second vacuum chuck stage implements uniform vacuum-fixation of almost the entire second field.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be described hereinafter in detail with reference to the accompanying drawings.

First Embodiment

Figure 1A:
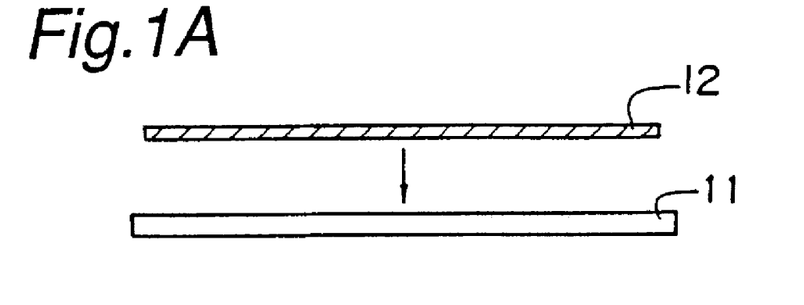
FIGS. 1A, 1B and 1C schematically show a procedure of thinning a semiconductor wafer according to the present invention.
Figure 1B:
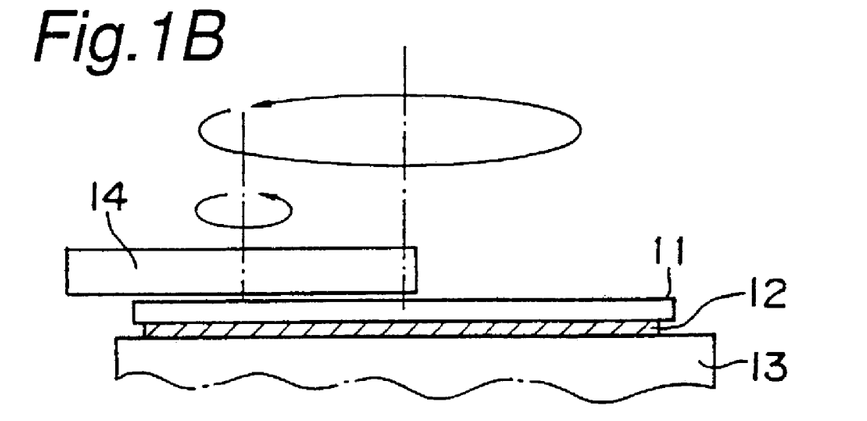
Figure 1C:
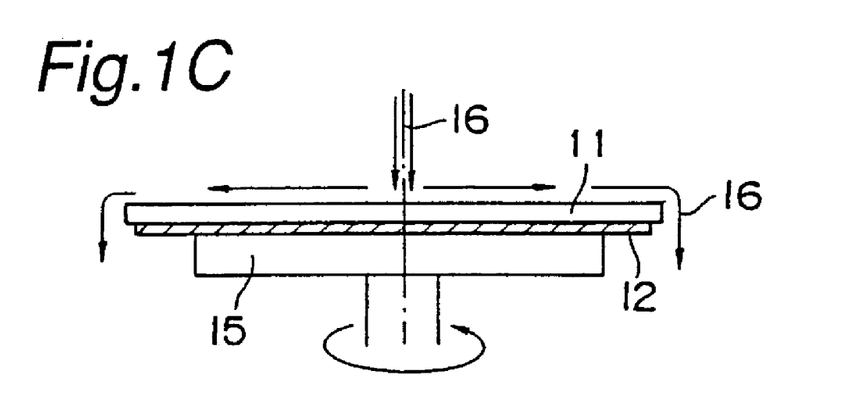

FIGS. 1A–1B show a procedure of thinning a semiconductor wafer in a first embodiment. More specifically, FIG. 1A shows a step of applying a protection tape, FIG. 1B shows a step of grinding the back of a wafer, and FIG. 1C shows a step of etching the back of the wafer.

First, as shown in FIG. 1A, a protection tape 12 having a diameter smaller than the diameter of a wafer 11 is applied to the front of the wafer 11. In applying the tape, there are available a method in which a long protection tape is attached to the wafer 11, and then the protection tape is cut so as to be smaller than the peripheral edge of the wafer, and a method in which a protection tape is cut in advance to be smaller than the size of the wafer 11, and is aligned and attached to the wafer 11.

Next, as shown in FIG. 1B, the protection tape 12 attached to the front of the wafer 11 is vacuum-fixed to a vacuum chuck stage 13 for use in grinding. While the vacuum chuck stage 13 is rotated, the back of the wafer 11 is brought into contact with a rotating grinding wheel 14 and ground.

As stated above, the diameter of the protection tape 12 is smaller than the diameter of the wafer 11. Consequently, for maintaining the finish quality, it is advisable to suppress vibration of the wafer 11 by reducing the grain size of the grinding wheel 14 or lowering a grinding speed.

Next, as shown in FIG. 1C, the protection tape 12 is vacuum-fixed to a vacuum chuck stage 15 for use in etching, so that the wafer 11 is fixed thereto. Then, while the vacuum chuck stage 15 is rotated, a chemical liquid 16 is applied to the wafer 11 from above, by which the back of the wafer 11 is etched.

At this point, the chemical liquid 16 dropped to a central portion of the back of the wafer 11 is spread from the central portion of the wafer 11 to the periphery thereof with rotation of the wafer 11, and then the liquid 16 falls down from the peripheral edge of the wafer 11. In this case, since the diameter of the protection tape 12 is smaller than the diameter of the wafer 11, the chemical liquid 16 is not accumulated on the protection tape 12. Consequently, unlike the case of FIG. 5C, part of the chemical liquid 16 will not infiltrate into the front side of the wafer 11.

Figure 2A:
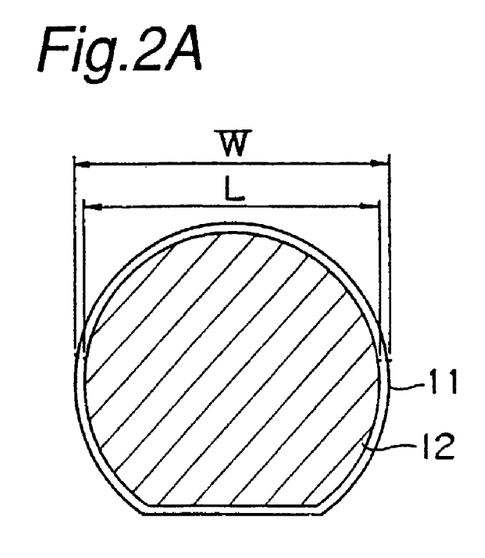
FIGS. 2A and 2B show a relationship between the diameter of a wafer and the diameter of a protection tape used in the procedure shown in FIGS. 1A–1C.
Figure 2B:
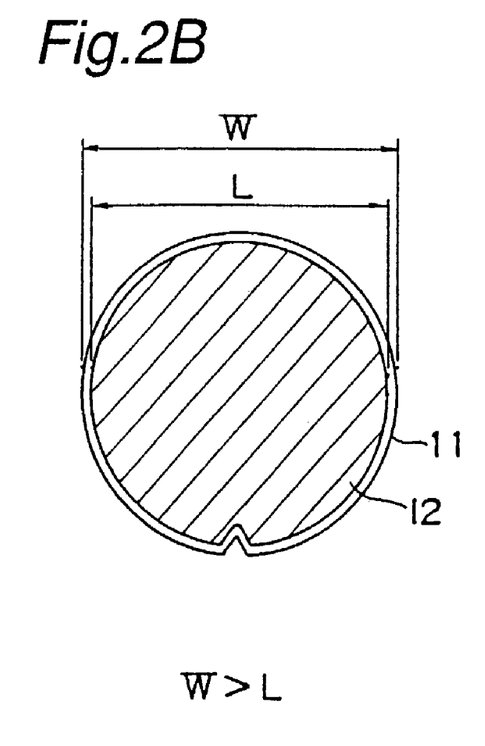

FIGS. 2A and 2B each show a relationship between the diameter W of the wafer 11 and the diameter L of the protection tape 12 according to the present embodiment. FIG. 2A shows an orientation flat-type wafer, and FIG. 2B shows a V-notched type wafer. In the present embodiment, the diameter L of the protection tape 12 is smaller than the diameter W of the wafer 11. Accordingly, to implement stable grinding without breakage and cracks of the periphery of the wafer 11 due to vibration and implement etching without infiltration of the chemical liquid 16 into the front side, the diameter W of the wafer 11 and the diameter L of the protection tape 12 are set to satisfy the condition indicated by the following expression (1).

$$L = W - a \quad (1)$$

where 0 mm < a ≦ 3 mm

Experiments have obtained best results for a=2 mm (1 mm per side). Although there is a difference by a wafer diameter, chamfering of about 0.5 mm is normally given to an edge potion of the wafer 11 for preventing breakage, fracture and/or cracks. For preventing the attached protection tape 12 from being detached, the protection tape 12 is preferably set not to overlap the chamfered portion. From this viewpoint as well, it is preferable to set the diameter W of the wafer 11 and the diameter L of the protection tape 12 such that the value of a is 2 mm (a=2 mm) as described above.

In the present embodiment, as stated above, when the protection tape 12 is applied to the front of the wafer 11 in the process of grinding and etching of the back of the wafer 11, the diameter W of the wafer 11 and the diameter L of the protection tape 12 are so set as to satisfy the expression (1). Namely, the diameter L of the protection tape 12 is smaller than the diameter W of the wafer 11 by a. Consequently, in the etching step the chemical liquid 16 dropped to the back of the wafer 11 is let down from the peripheral edge thereof with rotation of the wafer 11, and does not remain on the protection tape 12. This makes it possible to prevent part of the chemical liquid 16 from permeating into the front side of the wafer 11 and causing contamination.

In addition, a difference between the diameter L of the protection tape 12 and the diameter W of the wafer 11 is set to be 3 mm (1.5 mm per side) or less. This makes it possible to control or suppress vibration of the wafer 11 attributed to grinding force in the grinding process, which implements stable grinding of the back without causing fractures of the periphery of the wafer 11. For the more stable grinding operation, it is preferred that the grain size of the grinding wheel 14 is decreased or the grinding speed is lowered.

As is obvious, the present embodiment provides a method of thinning semiconductor wafers which improves quality and reliability of semiconductor devices.

In the above embodiment, description is given of the case employing both the step of grinding the wafer 11 with use of the grinding wheel 14 and the step of etching with use of the chemical liquid 16. However, the present invention may be applied only to the etching step.

Second Embodiment

As shown in FIG. 1B, the back grinding device is adapted to vacuum-fix the wafer 11 to its vacuum chuck stage 13 via the protection tape 12, which is smaller in size than the wafer 11, and grind the back of the wafer 11 by rotating the grinding wheel 14 thereof. A peripheral portion of the front of the wafer 11 not covered with the protection tape 12 is not vacuum-fixed to the vacuum chuck stage 13. Therefore, during the grinding operation for the peripheral portion, vibration tends to be generated there.

For controlling vibration of the wafer 11 to thereby achieve a stable back grinding operation, it is necessary, as stated above, to decrease the grain size of the grinding wheel 14 or decrease the grinding speed, which will, however, lead to the degraded throughput capacity of the back grinding device.

Accordingly, a second embodiment relates to a back grinding device for semiconductor wafers which enables the stable grinding of the back of a wafer attached with a protection tape smaller in size than the wafer.

Figure 3A:
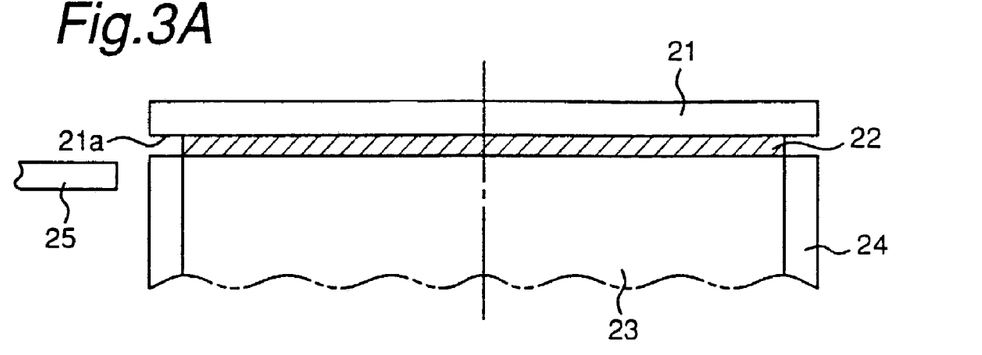
FIGS. 3A, 3B and 3C are partial side views of vacuum chuck stages for use in a back grinding device for semiconductor wafers of the present invention.
Figure 3B:
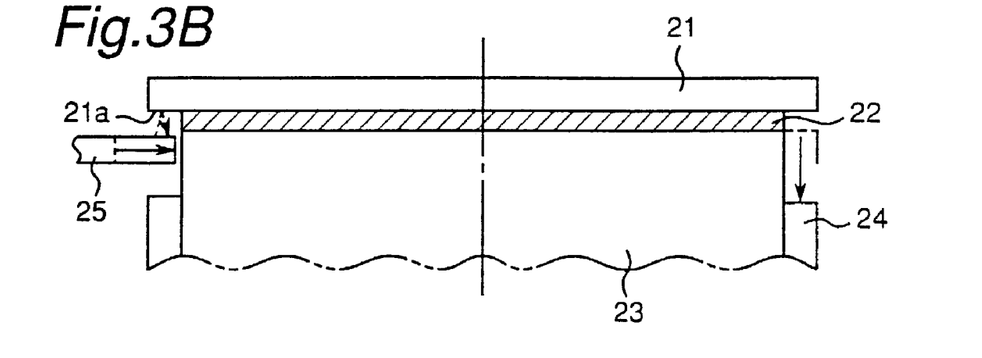
Figure 3C:
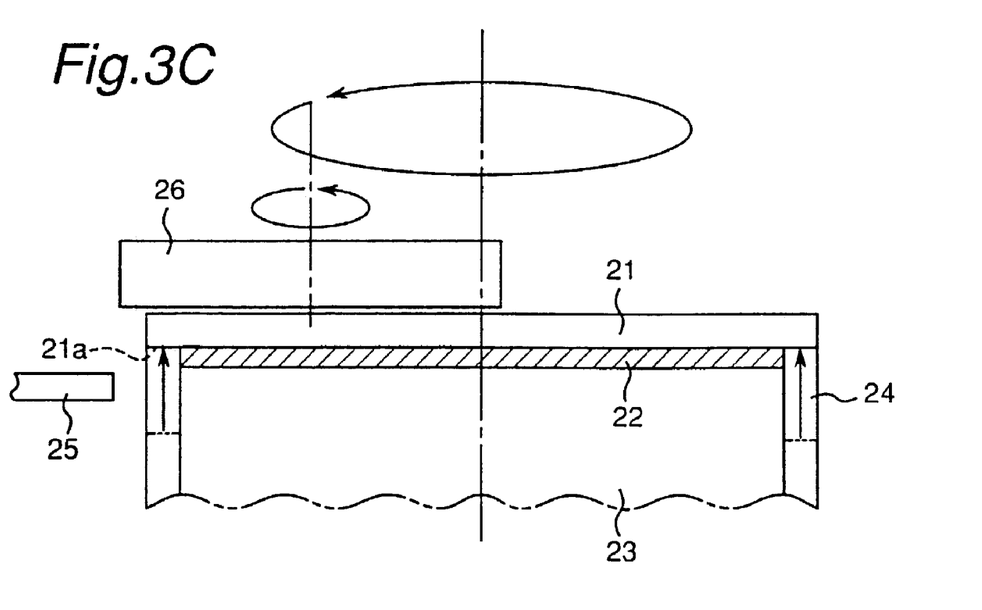

FIGS. 3A–3C are partial side views of a back grinding device in the second embodiment, showing vacuum chuck stages for use in grinding (just referred to as vacuum chuck stages) of the back grinding device. In these figures, there are shown a wafer 21, a protection tape 22, a first vacuum chuck stage 23, a second vacuum chuck stage 24, a distance detector 25, and a grinding wheel 26. Reference numeral 21a represents a peripheral area of the front of the wafer 21 to which no protection tape 22 is attached.

The back grinding device for semiconductor wafers having the above constitution operates as follows. First, as shown in FIG. 3A, the front of a wafer 21 is vacuum-fixed to the first vacuum chuck stage 23 via the attached protection tape 22 having a size, or diameter, smaller than that of the wafer 21. In this case, the diameter of the first vacuum chuck stage 23 is set to be slightly larger than or equal to that of the protection tape 22. The cylindrical second vacuum chuck stage 24 having an annular cross sectional shape corresponding to the shape of the peripheral area 21a of the front of the wafer 21 is fit around the cylindrical or columnar first vacuum chuck stage 23 in a slidable manner along a central axis of the first vacuum chuck stage 23.

Next, as shown in FIG. 3B, the second vacuum chuck stage 24 is lowered. Then, the distance detector 25, which was located on a lateral side of the second vacuum chuck stage 24 when the latter was in a state shown in FIG. 3A, is moved forward to a position beneath the peripheral area 21a of the front of the wafer 21. Then, the distance detector 25 radiates rays of light such as laser beams to the peripheral area 21a of the wafer 21. Upon reception of reflected rays of light from the wafer 21, the distance detector 25 detects a distance to the wafer 21 in a noncontact manner. After detecting the distance to the wafer 21, the distance detector 25 is retracted to the original position.

Next, as shown in FIG. 3C, the second vacuum chuck stage 24 is raised back beyond its original level shown in FIG. 3A by a distance based on the distance detection result provided by the distance detector 25, so that an upper end of the second vacuum chuck stage 24 comes into contact with the peripheral area 21*a* of the wafer 21 to support the area 21*a* by vacuum from the downside. Thus, the entire front surface of the wafer 21 including the main area with the protection tape 22 and the peripheral area 21*a* without the protection tape 22 is vacuum-supported by the first vacuum chuck stage 23 and the second vacuum chuck stage 24 in association. Then, as shown in FIG. 3C, the rotary grinding wheel 26 is brought into contact with the back of the wafer 21 from the upper side and the back is ground with the same process as the prior art.

Upon completion of the back grinding process of the wafer 21, and after releasing the peripheral area 21*a* of the wafer 21 from the vacuum-fixed condition, the second vacuum chuck stage 24 is lowered back to the original level which is the same level as the first vacuum chuck stage 23. After that, the wafer 21 is released from vacuum-fixation by the first vacuum chuck stage 23, and the back-grounded wafer 21 with the protection tape 22 attached to the front thereof is removed or unloaded from the back grinding device. The wafer 21 is then forwarded to the etching step for removing damages generated in the back grinding process.

After that, in the condition that the first vacuum chuck stage 23 and the second vacuum chuck stage 24 are positioned at the same level, the upper end faces of the first vacuum chuck stage 23 and the second vacuum chuck stage 24 are cleaned with use of the grinding wheel 26, a brush (unshown), and the like for removing dust generated in the back grinding process. After the cleaning is completed, a next wafer 21 to be ground is vacuum-fixed to the first vacuum chuck stage 23 via the protection tape 22 as shown in FIG. 3A, and waits for the back grinding operation.

Figure 4:
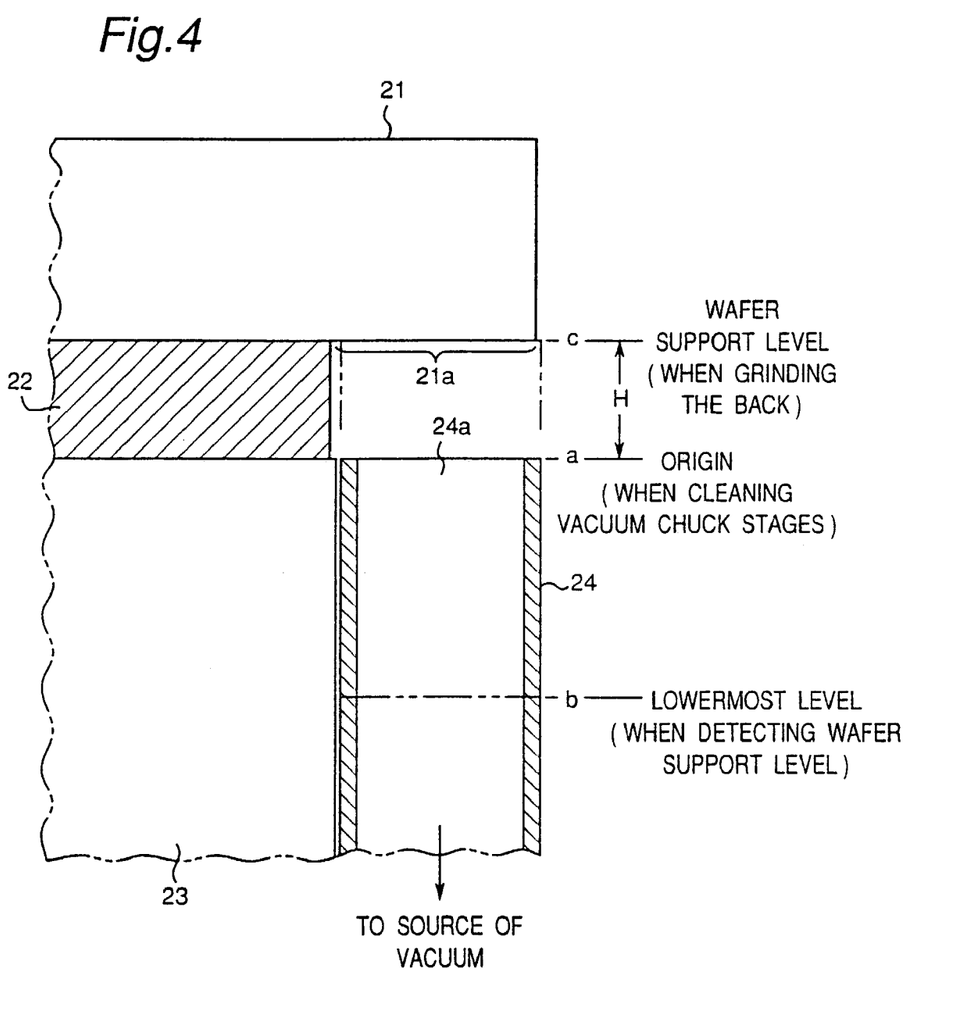
FIG. 4 is a partially sectional view showing in detail a top portion of a second vacuum chuck stage and its vicinity shown in FIGS. 3A–3C.

FIG. 4 shows a top portion of the second vacuum chuck stage 24 in detail in section and the vicinity of the top portion as well. The operation of the second vacuum chuck stage 24 will be described in more detail with reference to FIG. 4. In the figure, reference numeral 24*a* denotes a suction port of the second vacuum chuck stage 24.

In FIG. 4, a wafer 21 is supported by the first vacuum chuck stage 23 via the attached protection tape 22 that is smaller in diameter than the wafer 21. In this case, the diameter of the first vacuum chuck stage 23 is set to be slightly larger than that of the protection tape 22. The first vacuum chuck stage 23 is surrounded by the second vacuum chuck stage 24 having a cross sectional shape corresponding to the shape (annular shape) of the peripheral area 21*a* of the front of the wafer 21. The upper end face of the second vacuum chuck stage 24 is at the same level as the upper end face of the first vacuum chuck stage 23. This level is set as an origin 'a' of the level of the second vacuum chuck stage 24. When cleaning the upper surfaces of the first vacuum chuck stage 23 and the second vacuum chuck stage 24 as stated above, the second vacuum chuck stage 24 is positioned at the original level a. Also, loading and unloading of wafers 21 before and after undergoing the back grinding process are also performed at this original level a.

As stated before, after the wafer 21 is supported by vacuum by the first vacuum chuck stage 23, the second vacuum chuck stage 24 is lowered to a lowermost level 'b'. At this lowermost level b, a distance H from the original level a to the peripheral area 21*a* of the wafer 21 is detected by the distance-detector 25 as stated above. Based on a detection result by the distance detector 25, the second vacuum chuck stage 24 is raised to a level c of the peripheral area 21*a* and brought into contact with the peripheral area 21*a*, where the wafer 21 is supported by vacuum through the suction port 24*a* and subjected to the back grinding process. It is noted that the distance H is generally the same as the thickness of the protection tape 22.

As shown in the above description, the back grinding device for semiconductor wafers according to the present embodiment includes the cylindrical first vacuum chuck stage 23 which has a size or diameter slightly larger than or equal to that of the protection tape 22 and which vacuum-fixes the front of the wafer 21 via an attached protection tape 22 which in turn has a size or diameter smaller than that of the wafer 21. Also, around the cylindrical first vacuum chuck stage 23 is fit the cylindrical second vacuum chuck stage 24 having an annular cross sectional shape corresponding to the shape of the peripheral area 21*a*, attached with no protection tape 22, of the front of the wafer 21 in a slidable manner along the central axis of the first vacuum chuck stage 23.

And, in the condition that the front of the second vacuum chuck stage 24 is at the original level a, which is the same level as the upper surface of the first vacuum chuck stage 23, a wafer 21 to undergo the back grinding process is fed, and the front of the wafer 21 is vacuum-fixed to the first vacuum chuck stage 23 via the protection tape 22. Then, the second vacuum chuck stage 24 is lowered to the lowermost level b, at which the distance H from the origin level a to the area 21*a* of the wafer 21 is detected by the distance detector 25. Based on the detected distance H, the second vacuum chuck stage 24 is raised to the level c of the area 21*a* (namely, wafer support level) and brought into contact with the wafer 21. Through the suction port 24*a* of the second vacuum chuck stage 24, the peripheral portion of the front of the wafer 21 is vacuum-fixed.

According to the present embodiment, therefore, the peripheral area 21*a* of the front of the wafer 21 with no protection tape 22 attached can be vacuum-fixed to the second vacuum chuck stage 24, and therefore when grinding the peripheral portion of the back of the wafer 21, generation of vibration is prevented. Consequently, it is possible to implement the stable back grinding of the wafer 21 without decreasing the grain size of the grinding wheel 26 nor decreasing the grinding speed, thereby realizing prevention of the degraded throughput capacity.

It would be understood that a displacement means or mechanism for raising and lowering the second vacuum chuck stage 24 is not limited to a device of a specific type but may be of any type. However, because the first vacuum chuck stage 23 and the second vacuum chuck stage 24 serve to vacuum-fix the wafer 21, it would be preferable to use an elevating device utilizing air pressure such as an air cylinder.

As is obvious from the above description, in the method of thinning a semiconductor wafer according to an aspect of the present invention, a protection tape attached to a front surface of a semiconductor wafer is smaller in size than the semiconductor wafer. Accordingly, when the semiconductor wafer is fixed to the vacuum chuck stage via the protection tape and subjected to etching of its back surface, no chemical liquid is accumulated on the protection tape. Consequently, no chemical liquid infiltrates into the front surface of the semiconductor wafer, and therefore the front surface of the semiconductor wafer is prevented from being contaminated in its peripheral portion.

Further, because the diameter W of the semiconductor wafer and the diameter L of the protection tape are set to have a relationship of L=W−a (0 mm<a≦3 mm) in one embodiment, the periphery of the semiconductor wafer is prevented from being cracked or broken due to vibration attributed to the grinding force in the process of grinding with a grinding wheel. That is, the back grinding operation is performed stably. In addition, although the size of the semiconductor wafer is reduced in the process of etching its back, the protection tape is prevented from becoming larger in size than the semiconductor wafer, which ensures a stable etching process.

According to the present invention, therefore, semiconductor devices with high quality and reliability can be provided with the method with high productivity.

Further, because the peripheral portion of the protection tape is disposed so as not to overlap the chamfered portion of the wafer edge of the semiconductor wafer in one embodiment, the protection tape is prevented from being detached at the peripheral edge from the wafer.

Further, because the back grinding device for semiconductor wafers according to another aspect of the invention includes the first vacuum chuck stage for vacuum-fixing the first area of the front of the wafer attached with the protection tape and the second vacuum chuck stage for vacuum-fixing the second area of the front of the semiconductor wafer attached with no protection tape, the entire front of the semiconductor wafer can be well fixed in the process of grinding the back of the semiconductor wafer. Therefore the vibration is prevented from occurring in grinding the peripheral portion of the back of the semiconductor wafer.

In other words, the present invention implements a stable back grinding process without necessity of lowering the grain size of a grinding wheel or decreasing a grinding speed for the back grinding. As a result, the throughput capacity of the back grinding of semiconductor wafers can be 1.5 times higher than that in the case of using conventional back grinding devices.

Further in one embodiment, the second vacuum chuck stage is brought into contact with the second area of the semiconductor wafer by being raised by the second vacuum chuck stage displacement means by a distance based on a detection result provided by the distance detector which detects a distance between the upper surface of the first vacuum chuck stage to which the semiconductor wafer is vacuum-fixed and the second area of the front of the semiconductor wafer. Consequently, the second vacuum chuck stage can fix the semiconductor wafer in a good condition without bending of the wafer even if the thickness of the protection tape varies because the second vacuum chuck stage does not pull down nor push up the second area of the semiconductor wafer.

Further, upon completion of grinding the back of the wafer, the second vacuum chuck stage displacement means lowers the second vacuum chuck stage to a level equal to the first vacuum chuck stage. This enables simultaneous cleaning of the fronts of the first vacuum chuck stage 23 and the second vacuum chuck stage 24, which facilitates removal of grinding dust and the like generated in the back grinding process.

Further in one embodiment, because the diameter of the first vacuum chuck stage is set to be slightly larger than or equal to the diameter of the protection tape, the second vacuum chuck stage is raised smoothly to the position of contact with the second area of the wafer without being disturbed by the protection tape. In addition, the second vacuum chuck stage implements uniform vacuum-fixation of approximately the entire second field.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of thinning a semiconductor wafer, comprising:
    applying a protection tape to a front of the semiconductor wafer, and
    etching a back of the semiconductor wafer to thereby thin the semiconductor wafer, wherein the protection tape is smaller in size than the semiconductor wafer.

2. The method of thinning a semiconductor wafer as defined in claim 1, further comprising, between applying a protection tape to a front of the semiconductor wafer and etching a back of the semiconductor wafer, grinding the back of the semiconductor wafer.

3. The method of thinning a semiconductor wafer as defined in claim 1, wherein a diameter W of the semiconductor wafer and a diameter L of the protection tape have the following relationship: L=W−a (0 mm<a≦3 mm).

4. The method of thinning a semiconductor wafer as defined in claim 1, wherein the semiconductor wafer has a chamfered portion along an edge thereof, and no peripheral portion of the protection tape overlaps the chamfered portion of the edge of the semiconductor wafer.

5. The method of thinning a semiconductor wafer as defined in claim 1, wherein during the etching no portion of the protection tape extends to an edge of the semiconductor wafer.

* * * * *